(12) United States Patent
DeMuth et al.

(10) Patent No.: US 11,344,978 B2
(45) Date of Patent: May 31, 2022

(54) MULTI-FUNCTIONAL INGESTER SYSTEM FOR ADDITIVE MANUFACTURING

(71) Applicant: Seurat Technologies, Inc., Mountain View, CA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene Berdichevsky, Oakland, CA (US)

(73) Assignee: Seurat Technologies, Inc., Wilmington, MA (US)

( * ) Notice: Subject to any disclaimer, the term of this patent is extended or adjusted under 35 U.S.C. 154(b) by 71 days.

(21) Appl. No.: 16/778,860

(22) Filed: Jan. 31, 2020

(65) Prior Publication Data
US 2020/0164438 A1 May 28, 2020

Related U.S. Application Data

(63) Continuation of application No. 15/336,239, filed on Oct. 27, 2016, now Pat. No. 10,583,484.
(Continued)

(51) Int. Cl.
*B23K 37/04* (2006.01)
*B29C 64/264* (2017.01)
(Continued)

(52) U.S. Cl.
CPC .......... *B23K 37/0408* (2013.01); *B22F 3/24* (2013.01); *B22F 10/00* (2021.01); *B22F 12/00* (2021.01);
(Continued)

(58) Field of Classification Search
CPC .......... B22F 3/1055; B22F 2003/1056; B22F 3/008; B29C 64/153; B29C 64/386;
(Continued)

(56) References Cited

U.S. PATENT DOCUMENTS 3,080,760 A * 3/1963 Piersma ................... G01N 1/08
73/863.31
4,286,466 A * 9/1981 Stewart ................... G01N 1/14
73/863.83
(Continued)

FOREIGN PATENT DOCUMENTS

CN 206217173 U * 6/2017
GB 2473642 A * 3/2011 ............ B41J 11/009
(Continued)

*Primary Examiner* — David A. Rogers
(74) *Attorney, Agent, or Firm* — David R. Stevens; Stevens Law Group

(57) ABSTRACT

A method and an apparatus for collecting powder samples in real-time in powder bed fusion additive manufacturing may involves an ingester system for in-process collection and characterizations of powder samples. The collection may be performed periodically and uses the results of characterizations for adjustments in the powder bed fusion process. The ingester system of the present disclosure is capable of packaging powder samples collected in real-time into storage containers serving a multitude purposes of audit, process adjustments or actions.

11 Claims, 12 Drawing Sheets

Related U.S. Application Data

(60) Provisional application No. 62/248,758, filed on Oct. 30, 2015, provisional application No. 62/248,765, filed on Oct. 30, 2015, provisional application No. 62/248,770, filed on Oct. 30, 2015, provisional application No. 62/248,776, filed on Oct. 30, 2015, provisional application No. 62/248,783, filed on Oct. 30, 2015, provisional application No. 62/248,791, filed on Oct. 30, 2015, provisional application No. 62/248,799, filed on Oct. 30, 2015, provisional application No. 62/248,966, filed on Oct. 30, 2015, provisional application No. 62/248,968, filed on Oct. 30, 2015, provisional application No. 62/248,969, filed on Oct. 30, 2015, provisional application No. 62/248,980, filed on Oct. 30, 2015, provisional application No. 62/248,989, filed on Oct. 30, 2015, provisional application No. 62/248,780, filed on Oct. 30, 2015, provisional application No. 62/248,787, filed on Oct. 30, 2015, provisional application No. 62/248,795, filed on Oct. 30, 2015, provisional application No. 62/248,821, filed on Oct. 30, 2015, provisional application No. 62/248,829, filed on Oct. 30, 2015, provisional application No. 62/248,833, filed on Oct. 30, 2015, provisional application No. 62/248,835, filed on Oct. 30, 2015, provisional application No. 62/248,839, filed on Oct. 30, 2015, provisional application No. 62/248,841, filed on Oct. 30, 2015, provisional application No. 62/248,847, filed on Oct. 30, 2015, provisional application No. 62/248,848, filed on Oct. 30, 2015.

(51) Int. Cl.

| | | |
|---|---|---|
| *B29C 64/153* | (2017.01) | |
| *B33Y 10/00* | (2015.01) | |
| *B33Y 40/00* | (2020.01) | |
| *B33Y 50/02* | (2015.01) | |
| *B33Y 70/00* | (2020.01) | |
| *B33Y 80/00* | (2015.01) | |
| *B33Y 99/00* | (2015.01) | |
| *B23K 26/12* | (2014.01) | |
| *B23K 26/142* | (2014.01) | |
| *B23K 26/144* | (2014.01) | |
| *B23K 26/70* | (2014.01) | |
| *B29C 64/386* | (2017.01) | |
| *B29C 64/268* | (2017.01) | |
| *B22F 3/24* | (2006.01) | |
| *B23K 15/00* | (2006.01) | |
| *B23K 15/06* | (2006.01) | |
| *B23K 26/03* | (2006.01) | |
| *B23K 26/08* | (2014.01) | |
| *B23K 26/16* | (2006.01) | |
| *B23K 26/36* | (2014.01) | |
| *B25J 11/00* | (2006.01) | |
| *G02B 7/14* | (2021.01) | |
| *G02B 7/16* | (2021.01) | |
| *G02B 7/182* | (2021.01) | |
| *G02B 15/04* | (2006.01) | |
| *G02B 15/10* | (2006.01) | |
| *G02B 19/00* | (2006.01) | |
| *G02F 1/01* | (2006.01) | |
| *G02F 1/1333* | (2006.01) | |
| *G02F 1/135* | (2006.01) | |
| *G05B 17/02* | (2006.01) | |
| *H01S 5/40* | (2006.01) | |
| *B22F 12/00* | (2021.01) | |
| *B22F 10/00* | (2021.01) | |
| *H01S 5/00* | (2006.01) | |
| *B23K 26/00* | (2014.01) | |
| *B23K 26/082* | (2014.01) | |
| *B23K 101/00* | (2006.01) | |
| *B23K 101/24* | (2006.01) | |
| *B23K 103/00* | (2006.01) | |
| *B23K 101/02* | (2006.01) | |
| *B29K 105/00* | (2006.01) | |
| *G02B 27/28* | (2006.01) | |
| *G07C 3/14* | (2006.01) | |
| *B22F 10/10* | (2021.01) | |
| *B33Y 30/00* | (2015.01) | |
| *B23K 26/342* | (2014.01) | |
| *B28B 1/00* | (2006.01) | |
| *G02B 26/08* | (2006.01) | |
| *G02B 27/09* | (2006.01) | |
| *G02B 27/14* | (2006.01) | |
| *G02B 27/00* | (2006.01) | |

(52) U.S. Cl.
CPC ........ *B23K 15/002* (2013.01); *B23K 15/0006* (2013.01); *B23K 15/0013* (2013.01); *B23K 15/0026* (2013.01); *B23K 15/0093* (2013.01); *B23K 15/06* (2013.01); *B23K 26/03* (2013.01); *B23K 26/032* (2013.01); *B23K 26/083* (2013.01); *B23K 26/0846* (2013.01); *B23K 26/123* (2013.01); *B23K 26/127* (2013.01); *B23K 26/1224* (2015.10); *B23K 26/142* (2015.10); *B23K 26/144* (2015.10); *B23K 26/16* (2013.01); *B23K 26/36* (2013.01); *B23K 26/702* (2015.10); *B23K 26/703* (2015.10); *B23K 26/704* (2015.10); *B23K 37/0426* (2013.01); *B25J 11/00* (2013.01); *B29C 64/153* (2017.08); *B29C 64/264* (2017.08); *B29C 64/268* (2017.08); *B29C 64/386* (2017.08); *B33Y 10/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 19/0047* (2013.01); *G02F 1/0136* (2013.01); *G02F 1/135* (2013.01); *G02F 1/133362* (2013.01); *G05B 17/02* (2013.01); *H01S 5/005* (2013.01); *H01S 5/4012* (2013.01); *B22F 10/10* (2021.01); *B22F 2003/247* (2013.01); *B22F 2003/248* (2013.01); *B22F 2998/10* (2013.01); *B22F 2999/00* (2013.01); *B23K 15/0086* (2013.01); *B23K 26/0006* (2013.01); *B23K 26/082* (2015.10); *B23K 26/342* (2015.10); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B28B 1/001* (2013.01); *B29K 2105/251* (2013.01); *B33Y 30/00* (2014.12); *G02B 26/0816* (2013.01); *G02B 27/0068* (2013.01); *G02B 27/0905* (2013.01); *G02B 27/141* (2013.01); *G02B 27/283* (2013.01); *G02B 27/286* (2013.01); *G05B 2219/49023* (2013.01); *G07C 3/146* (2013.01); *Y02P 10/25* (2015.11); *Y02P 80/40* (2015.11)

(58) Field of Classification Search
CPC ......... B33Y 10/00; B33Y 30/00; B33Y 50/02; B33Y 40/00; G01N 1/20; G01N 2033/0091
USPC .............................................. 73/863–864.91
See application file for complete search history.

(56) References Cited

U.S. PATENT DOCUMENTS

| | | | | |
|---|---|---|---|---|
| 4,718,288 A * | 1/1988 | Leschonski | ............... | G01N 1/20 73/863 |
| 4,771,641 A * | 9/1988 | Beltrop | ............... | G01N 1/18 73/863.31 |
| 4,782,945 A * | 11/1988 | Geiler | ............... | B65D 25/106 206/203 |
| 5,337,620 A * | 8/1994 | Kalidini | ............... | G01N 1/08 73/864.64 |
| 5,583,304 A * | 12/1996 | Kalidindi | ............... | G01N 1/20 73/863.56 |
| 6,253,629 B1 * | 7/2001 | Lee | ............... | G01N 1/08 73/864.45 |
| 6,339,966 B1 * | 1/2002 | Kalidindi | ............... | G01N 1/08 73/864.31 |
| 6,499,361 B1 * | 12/2002 | Costantino | ............... | G01N 1/28 73/863 |
| 6,851,459 B2 * | 2/2005 | Squirrell | ............... | G01N 1/2273 141/197 |
| 7,895,879 B2 * | 3/2011 | Robert | ............... | G01Q 40/02 73/1.89 |
| 8,562,897 B2 * | 10/2013 | Abe | ............... | B29C 64/153 264/497 |
| 8,650,974 B2 * | 2/2014 | Pritzke | ............... | G01N 1/20 73/863.81 |
| 9,360,816 B1 * | 6/2016 | Mabuchi | ............... | G03G 15/0879 |
| 9,889,450 B2 * | 2/2018 | She | ............... | B03B 9/00 |
| 9,999,924 B2 * | 6/2018 | Dave | ............... | B29C 64/393 |
| 10,226,817 B2 * | 3/2019 | Dave | ............... | B22F 10/20 |
| 2002/0124664 A1* | 9/2002 | Call | ............... | B01D 21/2455 73/863.22 |
| 2004/0063198 A1* | 4/2004 | Tilles | ............... | G01N 1/2273 435/287.2 |
| 2006/0111807 A1* | 5/2006 | Gothait | ............... | B29C 64/112 700/119 |
| 2011/0000322 A1* | 1/2011 | Chen | ............... | G01N 1/08 73/864.64 |
| 2011/0122999 A1* | 5/2011 | Vogtmeier | ............... | B22F 3/114 378/154 |
| 2012/0139166 A1* | 6/2012 | Abe | ............... | B22F 10/20 264/497 |
| 2013/0078006 A1* | 3/2013 | Kawashima | ....... | G03G 15/0818 399/279 |
| 2014/0140882 A1* | 5/2014 | Syassen | ............... | B33Y 30/00 419/53 |
| 2014/0186205 A1* | 7/2014 | O'Neill | ............... | B22F 1/0088 419/26 |
| 2014/0202381 A1* | 7/2014 | Ederer | ............... | B29C 64/35 118/209 |
| 2014/0314609 A1* | 10/2014 | Ljungblad | ............... | B29C 64/153 419/1 |
| 2015/0030494 A1* | 1/2015 | Ward-Close | ............... | B22F 10/20 419/19 |
| 2015/0125334 A1* | 5/2015 | Uetani | ............... | B22F 10/10 419/6 |
| 2015/0165681 A1* | 6/2015 | Fish | ............... | B29C 64/393 264/40.6 |
| 2016/0067779 A1* | 3/2016 | Dautova | ............... | B29C 64/153 419/7 |
| 2016/0121271 A1* | 5/2016 | Lescoche | ............... | C04B 38/0006 210/500.25 |
| 2016/0184893 A1* | 6/2016 | Dave | ............... | B29C 64/393 419/53 |
| 2016/0193696 A1* | 7/2016 | McFarland | ......... | B23K 26/342 219/76.12 |
| 2020/0147869 A1* | 5/2020 | Muir | ............... | B29C 64/268 |
| 2020/0182808 A1* | 6/2020 | Zhou | ............... | G06T 7/0004 |

FOREIGN PATENT DOCUMENTS

| | | | | |
|---|---|---|---|---|
| JP | 2001305040 A | * | 10/2001 | |
| JP | 2004037111 A | * | 2/2004 | |
| JP | 2005335199 A | * | 12/2005 | ............. B22F 10/70 |

* cited by examiner ion No. 15/336,239, filed on Oct. 27, 2016,
MULTI-FUNCTIONAL INGESTER SYSTEM FOR ADDITIVE MANUFACTURING

CROSS-REFERENCE TO RELATED PATENT APPLICATION

The present application is a continuation of U.S. patent application Ser. No. 15/336,239, filed on Oct. 27, 2016, which is incorporated by reference in its entirety.

That application claims priority benefit of

U.S. Patent Application No. 62/248,758, filed on Oct. 30, 2015,
U.S. Patent Application No. 62/248,765, filed on Oct. 30, 2015,
U.S. Patent Application No. 62/248,770, filed on Oct. 30, 2015,
U.S. Patent Application No. 62/248,776, filed on Oct. 30, 2015,
U.S. Patent Application No. 62/248,783, filed on Oct. 30, 2015,
U.S. Patent Application No. 62/248,791, filed on Oct. 30, 2015,
U.S. Patent Application No. 62/248,799, filed on Oct. 30, 2015,
U.S. Patent Application No. 62/248,966, filed on Oct. 30, 2015,
U.S. Patent Application No. 62/248,968, filed on Oct. 30, 2015,
U.S. Patent Application No. 62/248,969, filed on Oct. 30, 2015,
U.S. Patent Application No. 62/248,980, filed on Oct. 30, 2015,
U.S. Patent Application No. 62/248,989, filed on Oct. 30, 2015,
U.S. Patent Application No. 62/248,780, filed on Oct. 30, 2015,
U.S. Patent Application No. 62/248,787, filed on Oct. 30, 2015,
U.S. Patent Application No. 62/248,795, filed on Oct. 30, 2015,
U.S. Patent Application No. 62/248,821, filed on Oct. 30, 2015,
U.S. Patent Application No. 62/248,829, filed on Oct. 30, 2015,
U.S. Patent Application No. 62/248,833, filed on Oct. 30, 2015,
U.S. Patent Application No. 62/248,835, filed on Oct. 30, 2015,
U.S. Patent Application No. 62/248,839, filed on Oct. 30, 2015,
U.S. Patent Application No. 62/248,841, filed on Oct. 30, 2015,
U.S. Patent Application No. 62/248,847, filed on Oct. 30, 2015, and
U.S. Patent Application No. 62/248,848, filed on Oct. 30, 2015, which are incorporated by reference in its entirety.

TECHNICAL FIELD

The present disclosure generally relates to three-dimensional (3D) powder bed fusion additive manufacturing and, more particularly, to in-process (in real-time or in-situ) collection and sampling of powdered materials during a print cycle.

BACKGROUND

In 3D powder bed fusion additive manufacturing, known sourced and designated powders are preferred or required. This may be motivated by a number of reasons including (1) better print quality due to the powdered material meeting specifications tailored to the specific printer, (2) better audit trail of the powdered material composition and higher probability that it is free of defects, (3) protection of the printer from contaminants which might break the printer or cause more warranty repair, or (4) higher revenues and margins from sales of designated powdered materials. Interests of customers and powder suppliers may diverge when customers wish to use non-authorized powdered materials in a given printer. Furthermore, if a powdered material is reused, characteristics of the powdered material could change overtime such as particle size distribution and density. The elemental/alloy composition of a powdered material due to thermal cycling and oxidation may be altered during a print cycle. To most accurately account for these changes of a powdered material, the powder bed fusion additive manufacturing process may need to be adjusted periodically during a print process to improve the quality of printed objects.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1A:
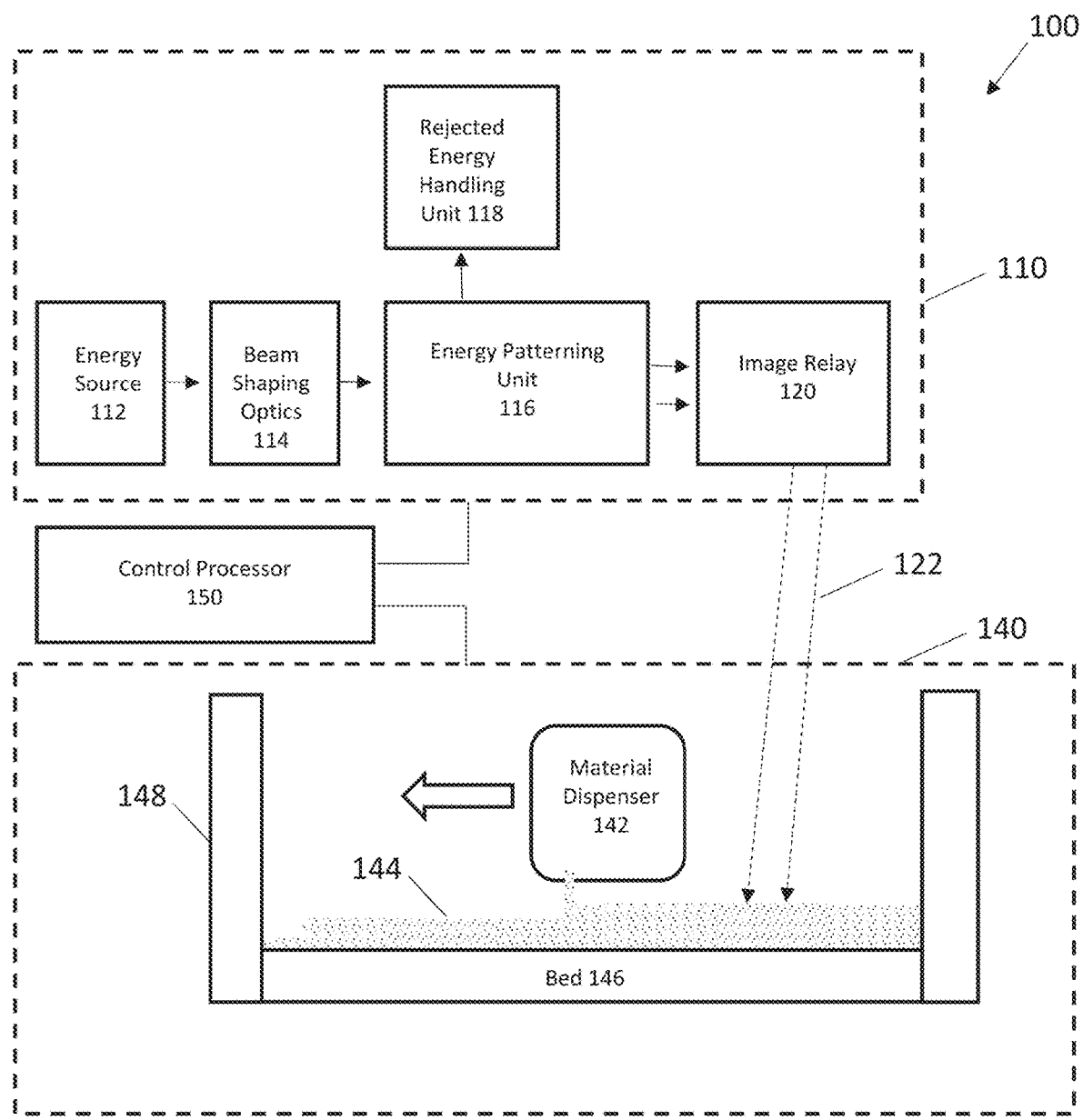
FIG. 1A illustrates an additive manufacturing system.

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

The present disclosure describes an ingester system used in powder bed fusion additive manufacturing that collects in-process (in real-time or in-situ) powder samples and performs a set of characterizations on the powder samples.

In various embodiments in accordance with the present disclosure, an ingester system may collect powder samples periodically at a predetermined interval during a print process. The powder samples may be stored for analysis later or may be characterized in real-time to understand changes of characteristics of the powders during the print process. The characterization results may determine whether to abort the print process or adjust printing parameters associated with powder bed fusion additive printing.

In some embodiments, powder samples may be collected and stored for later off-site analysis. This approach may help with diagnostics on properties of the printed object, audit of powder quality, consistency from powder suppliers as well as potential contract violation(s) by a customer using unauthorized powdered materials on the printer.

In another embodiment, a method of identifying unlicensed powder usage in an additive manufacturing system involves collecting a plurality of powder samples of a powdered material in real-time during a print job. The collected powder samples are used for audit and authorization by performing at least one of the following steps: i) storing the collected powder samples for later characterization; and ii) immediately characterizing the powder samples to determine whether to abort the print job according to a result of the set of characterizations.

An additive manufacturing system is disclosed which has one or more energy sources, including in one embodiment, one or more laser or electron beams, positioned to emit one or more energy beams. Beam shaping optics may receive the one or more energy beams from the energy source and form a single beam. An energy patterning unit receives or generates the single beam and transfers a two-dimensional pattern to the beam, and may reject the unused energy not in the pattern. An image relay receives the two-dimensional patterned beam and focuses it as a two-dimensional image to a desired location on a height fixed or movable build platform (e.g. a powder bed). In certain embodiments, some or all of any rejected energy from the energy patterning unit is reused.

In some embodiments, multiple beams from the laser array(s) are combined using a beam homogenizer. This combined beam can be directed at an energy patterning unit that includes either a transmissive or reflective pixel addressable light valve. In one embodiment, the pixel addressable light valve includes both a liquid crystal module having a polarizing element and a light projection unit providing a two-dimensional input pattern. The two-dimensional image focused by the image relay can be sequentially directed toward multiple locations on a powder bed to build a 3D structure.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/$MnCl_2$) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate(Nd:$YVO_4$) laser, Neodymium doped yttrium calcium oxoborateNd:$YCa_4O(BO_3)^3$ or simply Nd:YCOB, Neodymium glass(Nd:Glass) laser, Titanium sapphire(Ti:sapphire) laser, Thulium YAG (Tm:YAG) laser, Ytterbium YAG (Yb:YAG) laser, Ytterbium:$2O_3$ (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride(Ce:LiSAF, Ce:LiCAF), Promethium 147 doped phosphate glass($147Pm^{+3}$:Glass) solid-state laser, Chromium doped chrysoberyl (alexandrite) laser, Erbium doped anderbium-ytterbium co-doped glass lasers, Trivalent uranium doped calcium fluoride (U:$CaF_2$) solid-state laser, Divalent samarium doped calcium fluoride(Sm:$CaF_2$) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
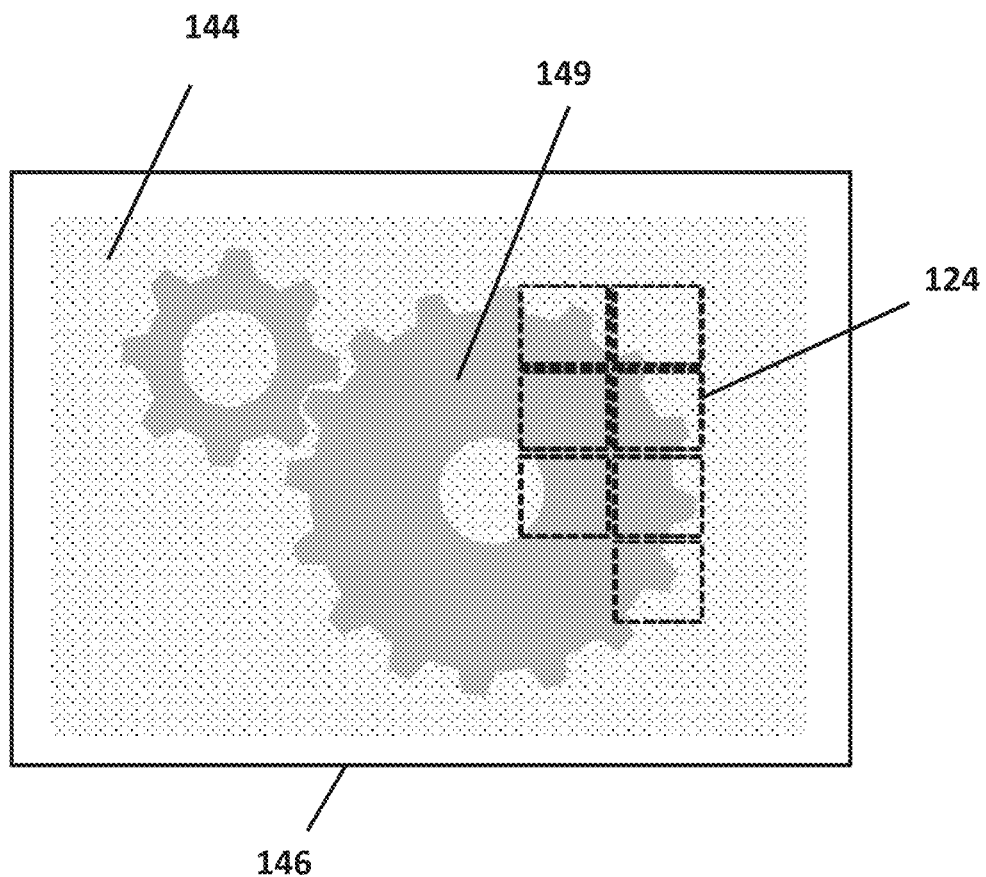
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
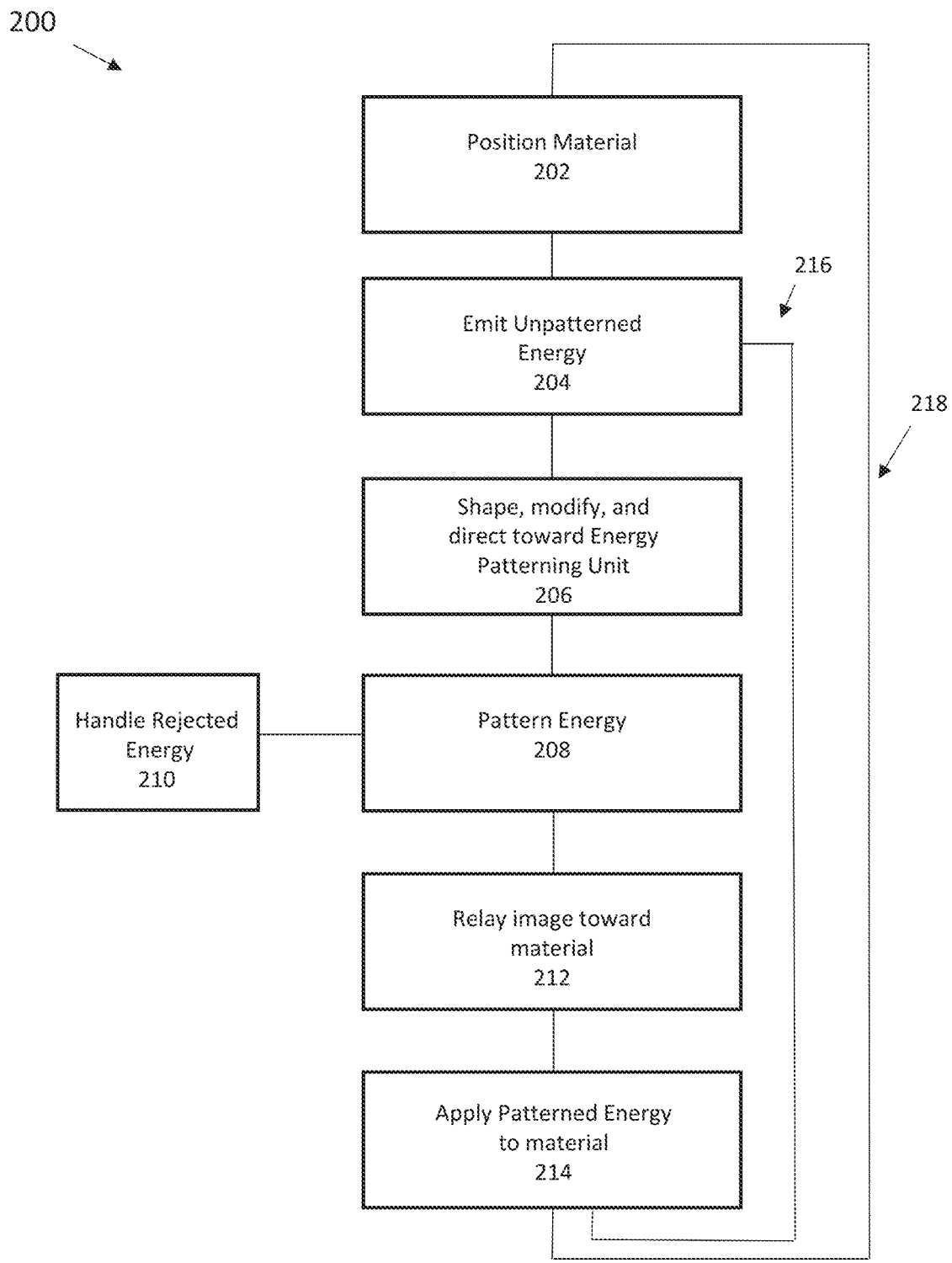
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
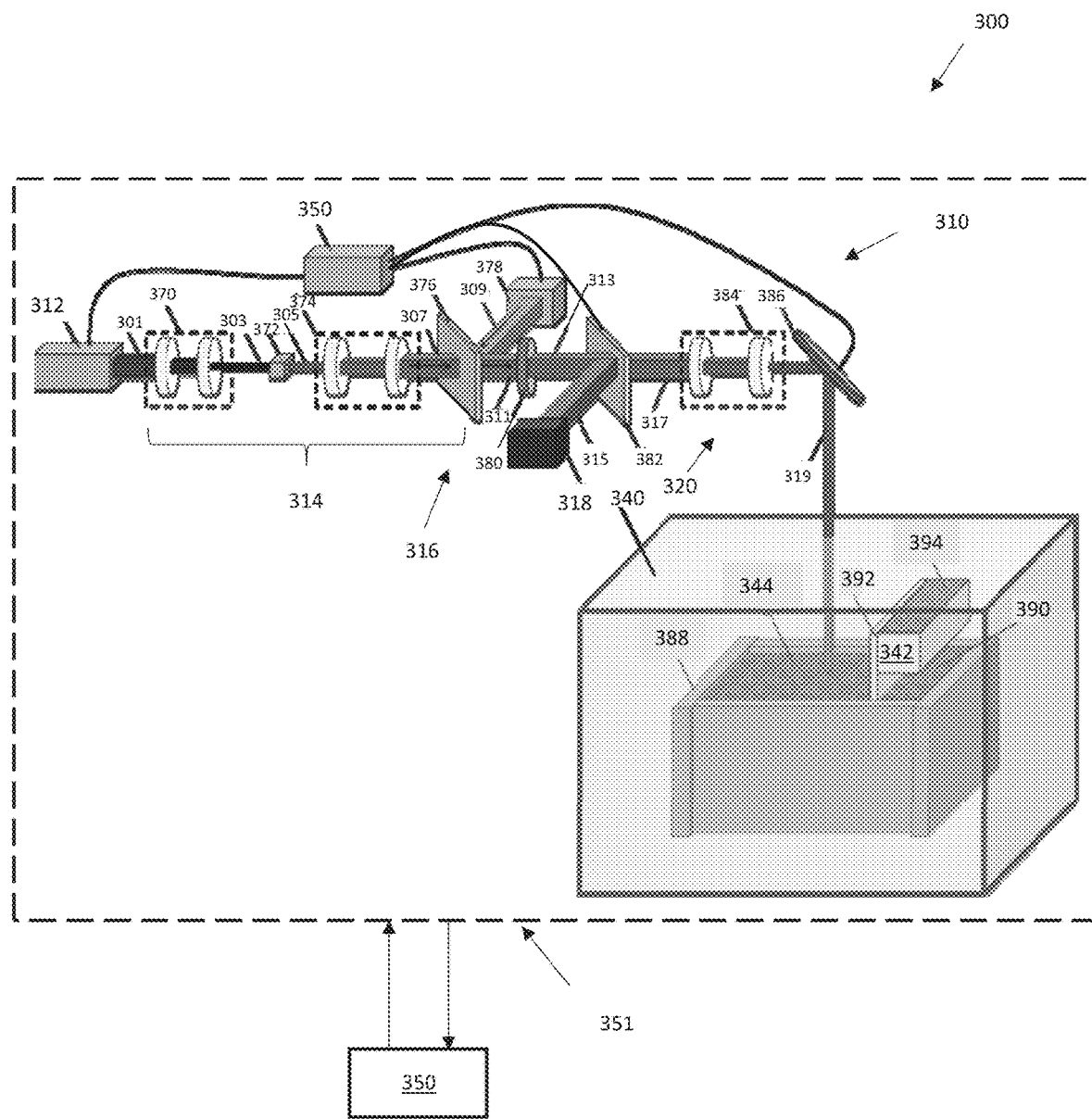
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
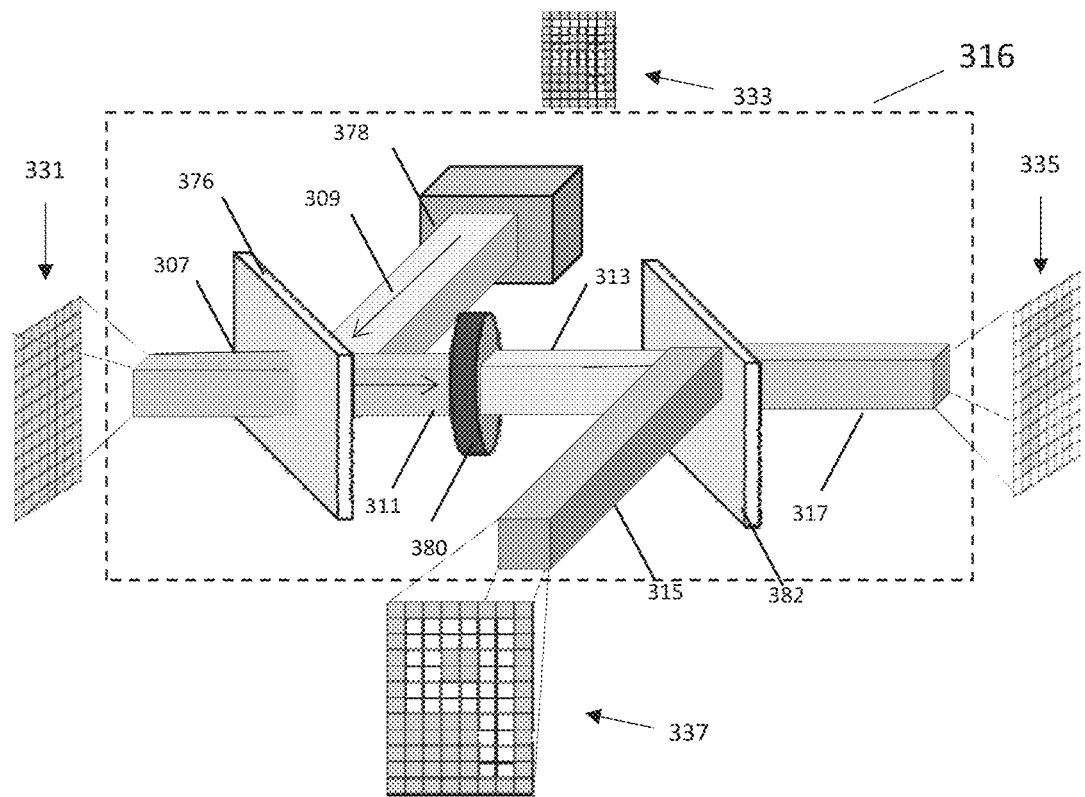
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
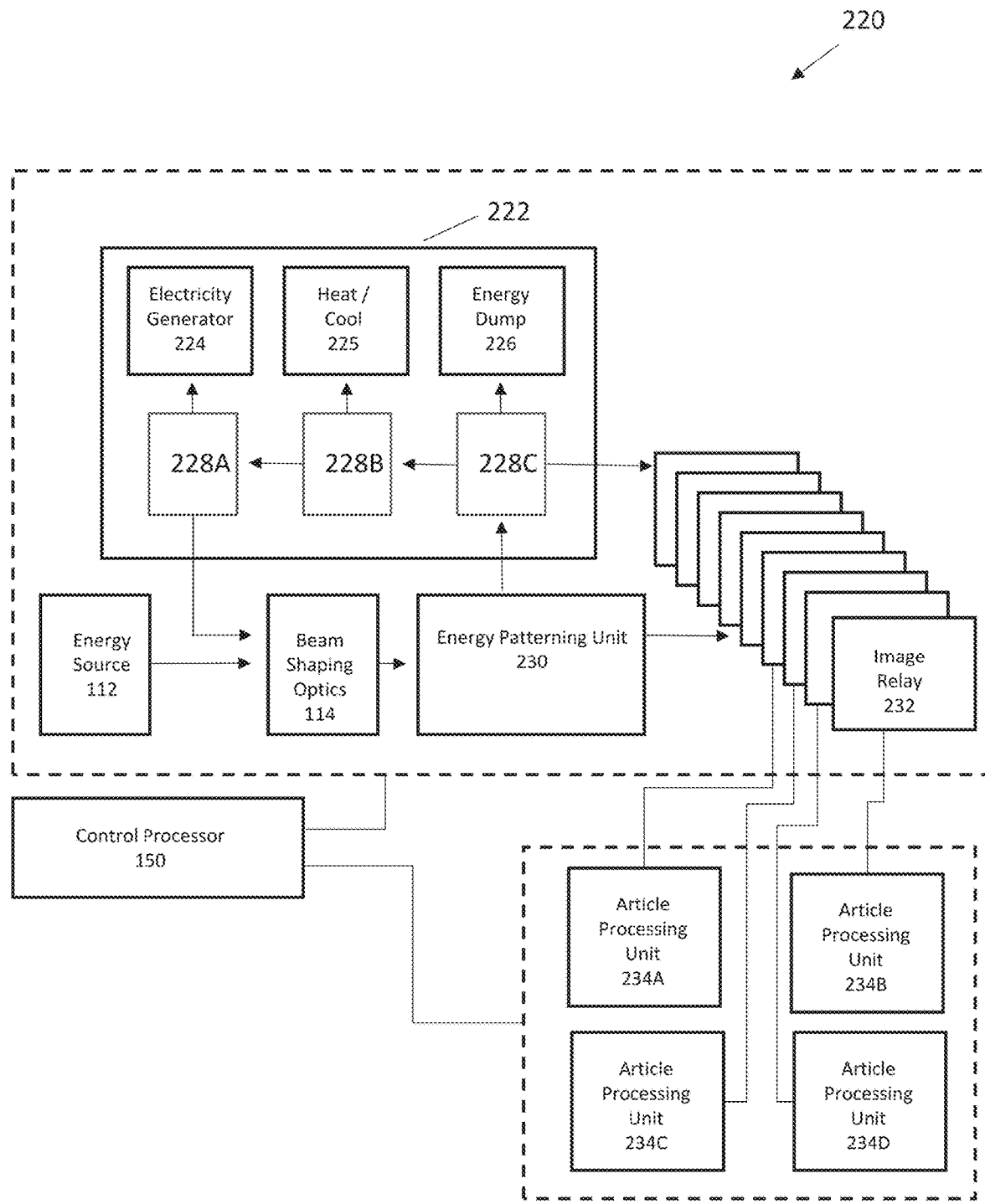
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
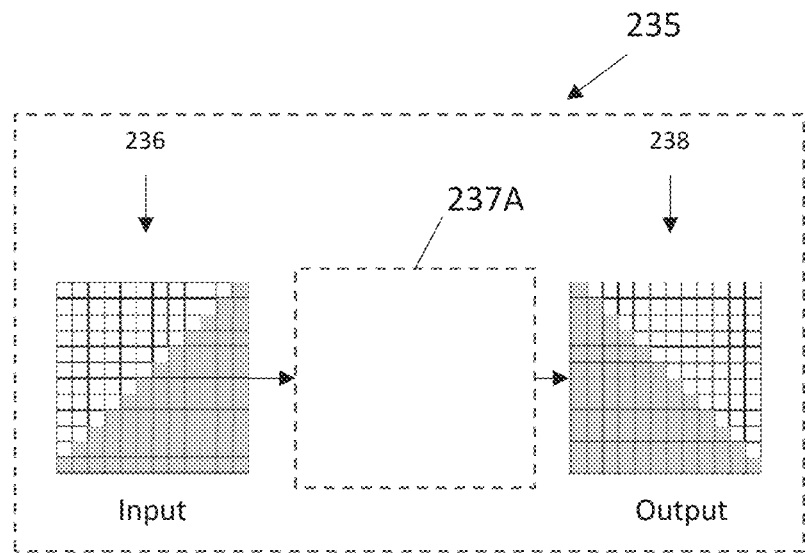
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
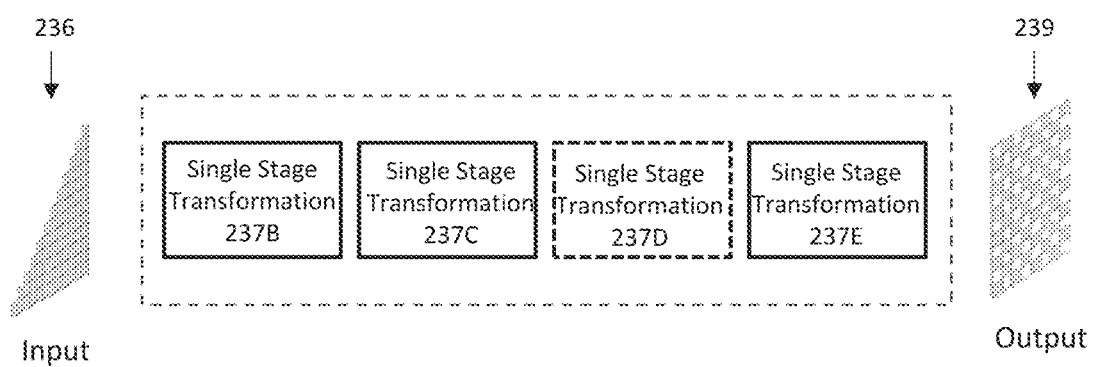
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
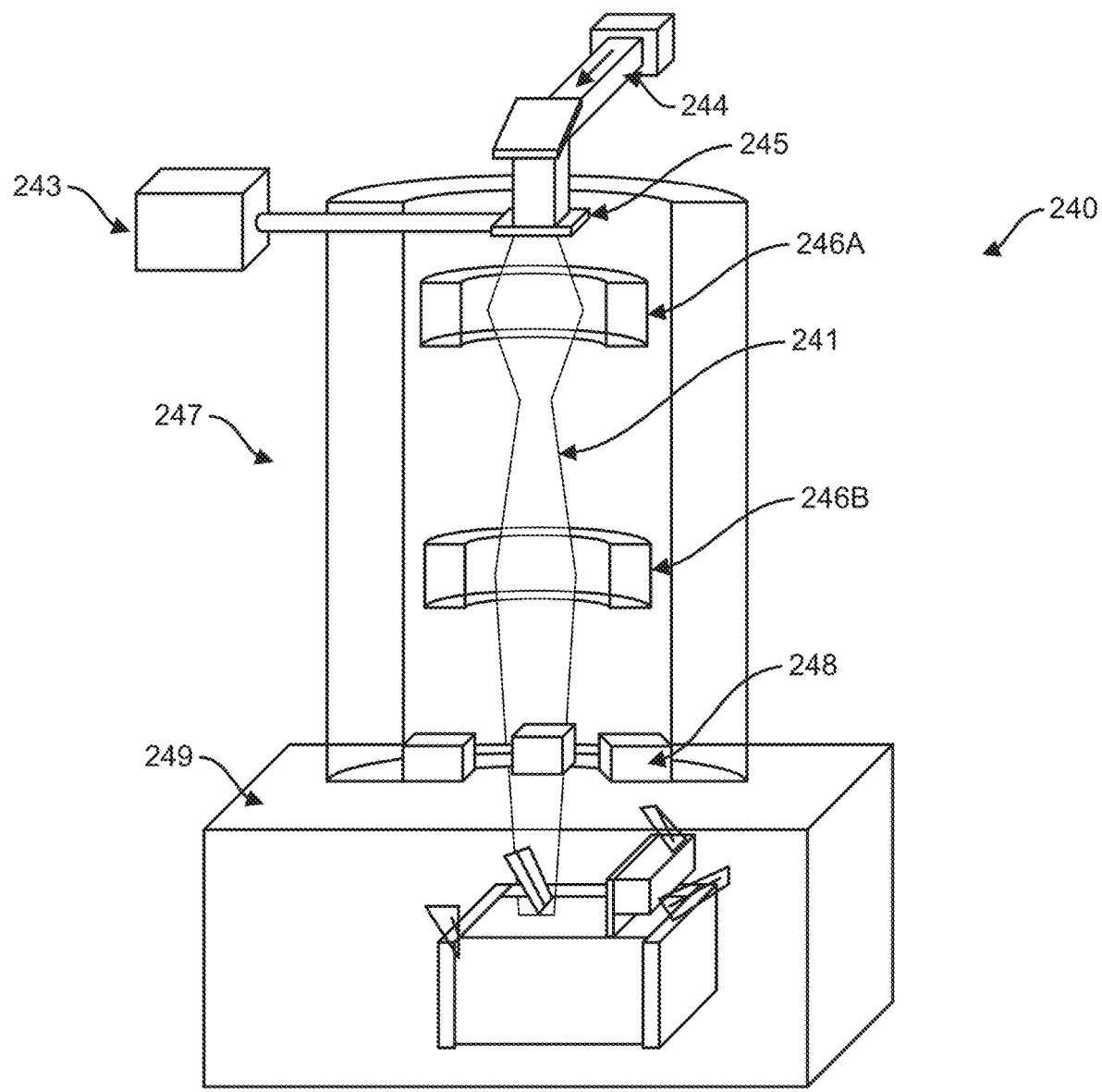
FIG. 3F illustrates an patternable electron energy beam additive manufacturing system.
Figure 3G:
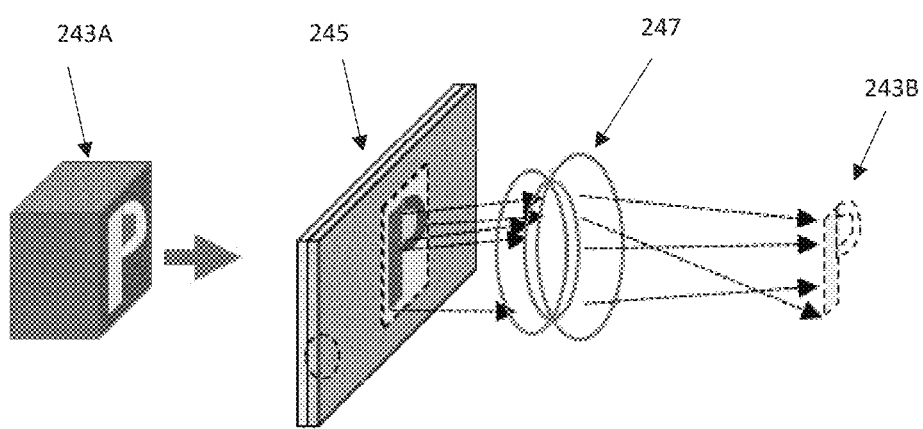
FIG. 3G illustrates a detailed description of the electron beam patterning unit shown in FIG. 3F.

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal.

Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

Figure 4:
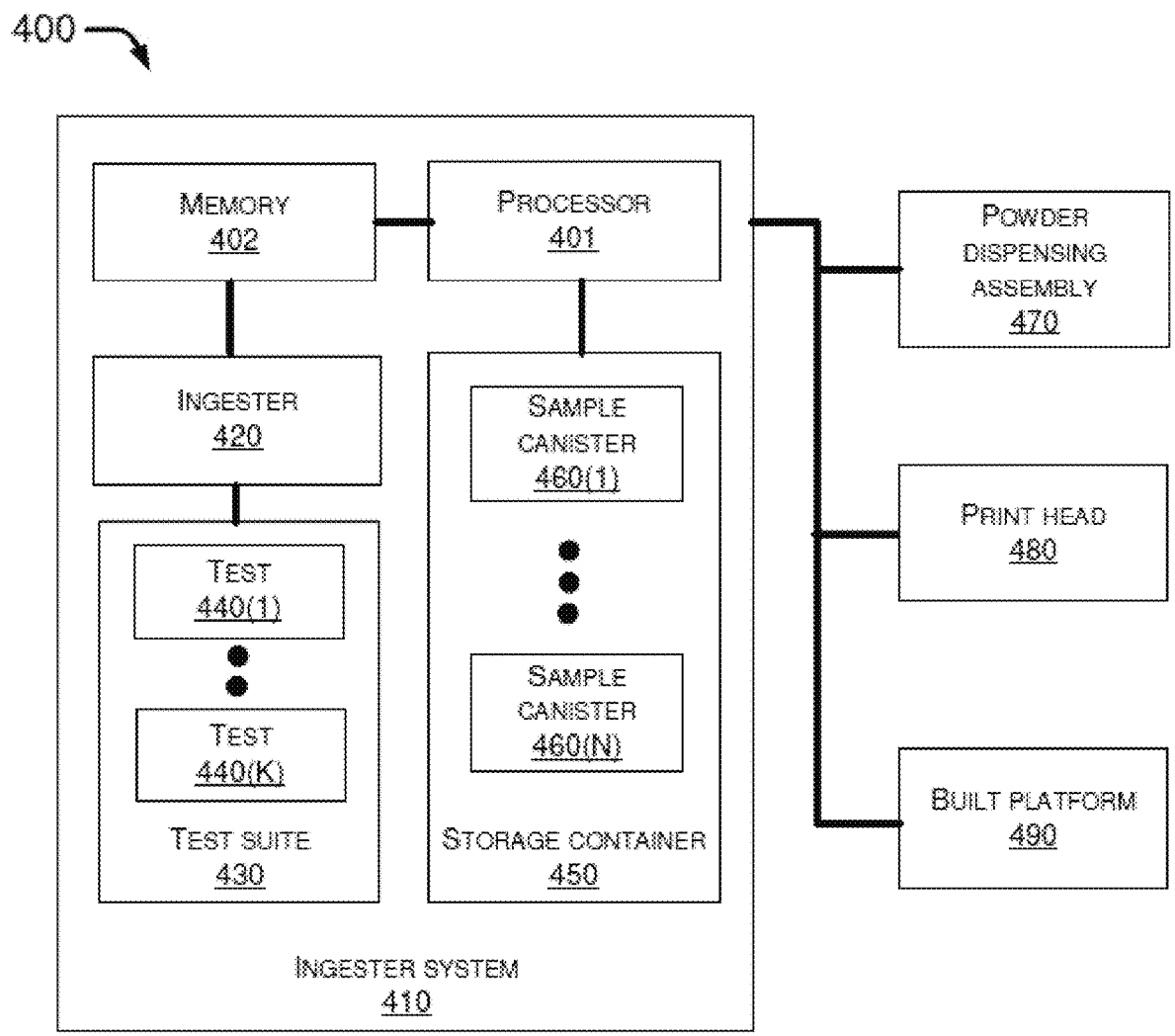
FIG. 4 is a block diagram depicting an example apparatus of an ingester system in accordance with an embodiment of the present disclosure.

FIG. 4 is a block diagram illustrating an example apparatus 400 including ingester system 410 in accordance with an embodiment of the present disclosure. Ingester system 410 may perform various functions related to techniques, methods and systems described herein, including those described below with respect to process 500 and implementation 600. Ingester system 410 may be installed in, equipped on, connected to or otherwise implemented in a powder bed fusion additive manufacturing system (such as that shown in FIGS. 1A, 1B, 2, 3A and 3B) to effect various embodiments in accordance with the present disclosure. Ingester system 410 may include at least some of the components illustrated in FIG. 4.

In some embodiments, ingester system 410 may involve ingester 420 collecting powder samples of a powdered material during powder bed fusion additive manufacturing. The powdered material may include metal, ceramic, plastic powders, or other suitable powders able to bond together while subjected to a thermal energy. The collection of powder samples may be performed periodically at a predetermined interval. The powder samples may be collected or taken by ingester 420 from the powder bed or the powder distribution system such as powder dispensing assembly 470. A mechanical assembly such as a scoop, diverter, or mechanical arm may be used to collect or pick up powder samples at predetermined locations.

In some embodiments, ingester system 410 may include storage container 450 capable of packaging the powder samples in a plurality of sample canister 460(1)-460(N), with N being a positive integer greater than 0. The sample canister 460(1)-460(N) may be stored for analyses that may not be suitable for in-process (in real-time or in-situ) characterization or for auditing purposes later. Storage container 450 may be capable of packaging powder samples in an atmosphere substantially equivalent to an in-process atmosphere inside sample canister 460(1)-460(N). The atmosphere may be air or an inert gas such as nitrogen, argon or helium.

In some embodiments, ingester system 410 may include test suite 430 capable of performing test 440(1)-440(K), with K being a positive integer. Test suite 430 may be a collection of instruments having capabilities to perform one or more tests of test 440(1)-440(K). For example, the collection of instruments may include dilatometer, flash diffusivity analyzer, gas chromatography mass spectrometry, gas pycnometer, inclinometer, particle size analyzer, particle shape analyzer, profilometer, scale, spectrometer, thermometer, tintometer, or other instruments capable of measuring properties or qualities of powders. Test 440(1)-440(K) may perform characterizations of powder samples on one or more specific properties respectively. The one or more specific properties of powder samples may include thermal diffusivity, density, surface roughness, weight, emissivity, absorptivity, reflectance, transmissivity, temperature, color, and particle size distribution. The one or more qualities of powder samples may include uniformity of particle size, uniformity of composition, or uniformity of surface roughness. Some powdered materials may have undergone undesired changes after a print cycle with inadequate processing conditions or thermal cycles. The inadequate processing conditions may include non-uniform thicknesses of a powder layer dispensed by powder dispensing assembly 470, an excessive temperature of a powder bed caused by an overheating of build platform 490, or an incident beam having an intensity too high. The results of characterization may be used to adjust printing parameters during a print process to improve print quality. The printing parameters may include a rate of dispensing to control a thickness uniformity, a temperature of built platform 490, and an intensity or dwell time (duration) of an incident beam to control a dimension, a pulse shape of energy source incident on the powder material modulated over time and position on the bed, and one or more specific electrical, mechanical, or optical properties of a printed object.

In some embodiments, the result of characterizations performed by Test 440(1)-440(K) may indicate significant alternation of one or more powder properties and beyond the range of workable specifications. The print process may be aborted in such conditions.

Ingester system 410 may include processor 401 and memory 402. Processor 401 may be coupled to memory 402 to access data stored therein and to execute any programs/instructions stored therein. Processor 701 may control ingester system 410 performing powder sample collection at a predetermined interval. Processor 401 may execute instructions as to which test of test 440(1)-440(K) in test suite 430 may be performed. Processor 401 may further control sample storage container 450 packaging the powder samples in sample canister 460(1)-460(N). The result of test 440(1)-440(K) may be stored in memory 402.

Example apparatus 400 may include components of a powder bed fusion additive manufacturing system such as powder dispensing assembly 470, print head 480, and build platform 490. Powder dispensing assembly 470 may dispense a plurality of layers of a powdered material to form a powder bed supported by build platform 490. Print head 480 may include an energy source (e.g., fiber laser or diode laser) capable of providing a light beam of sufficient energy to melt/sinter the powdered material. Build platform 490 may have resistive heating elements inside to control a temperature of a powder bed formed by layers of a powdered material. Processor 401 may control powder dispensing assembly 470, print head 480, and build platform 490 in response to characterization results of powder samples by ingester system 410 during a print process.

Figure 5:
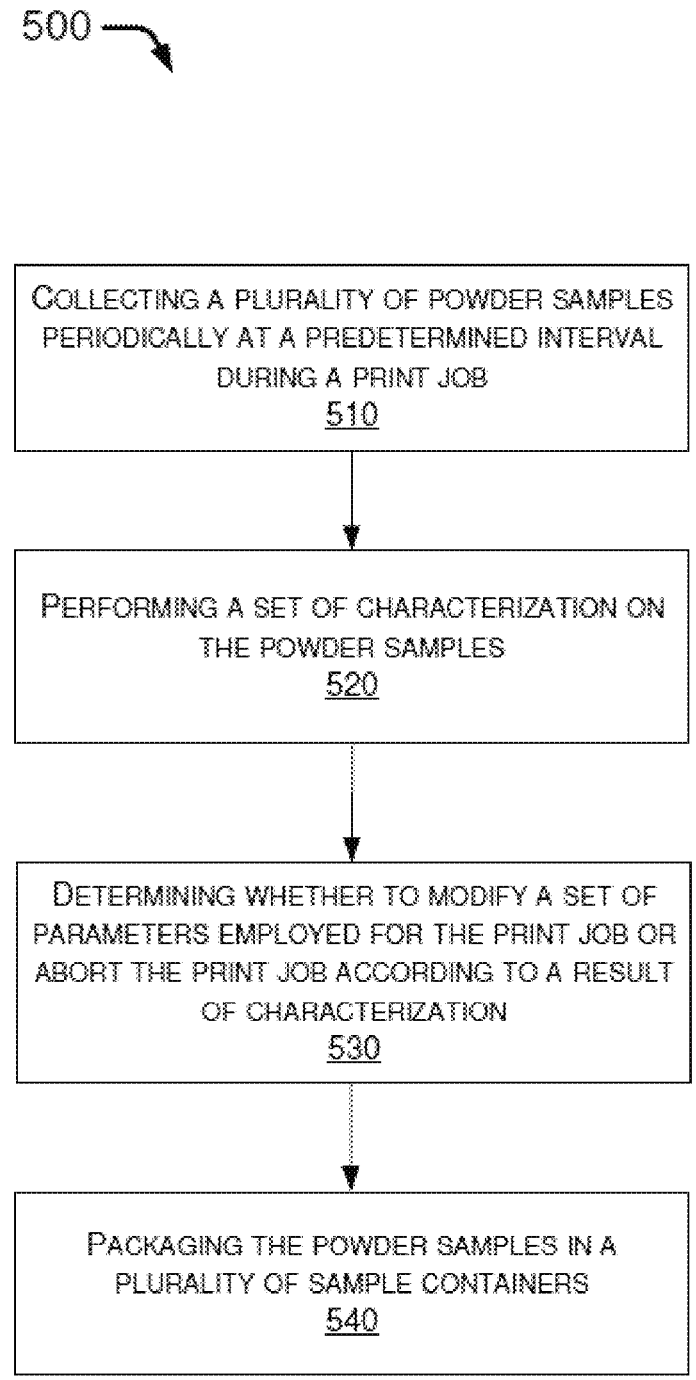
FIG. 5 is a flowchart depicting an example process of in-process collection and sampling of powder samples in accordance with an embodiment of the present disclosure.

FIG. 5 illustrates an example process 500 of collecting and characterizing powder samples of a powdered material during a print process. Process 500 may be utilized to collect the powder samples from a powder bed or a powder distribution assembly, and characterizing the powder samples in real-time in a test suite in accordance with the present disclosure. Process 500 may include one or more operations, actions, or functions shown as blocks such as 510, 520, 530, and 540. Although illustrated as discrete blocks, various blocks of process 500 may be divided into additional blocks, combined into fewer blocks, or eliminated, depending on the desired implementation, and may be performed or otherwise carried out in an order different from that shown in FIG. 5. Process 500 may be implemented in example implementation 600, and may be implemented by example apparatus 400 described above. For illustrative purposes and without limiting the scope, the following description of process 500 is provided in the context of example implementation 600 as being implemented by example apparatus 400. Process 500 may begin with block 510.

At 510, process 500 may involve processor 401 of example apparatus 400 controlling ingester 420 to collect a plurality of powder samples of a powdered material in forming a printed object during a print cycle. The powdered material may include metal, ceramic, plastic powders, or other suitable powders able to bond together while subjected to a thermal energy. At 510, processor 401 may instruct ingester 420 collecting powder samples periodically at a predetermined interval or randomly or at predetermined stages during a print process. For example, processor 401 may instruct ingester 420 to collect powder samples at every 10-minute interval or only at ⅕th and ⅘th completion of a print process. Ingester 420 may have a mechanism for diverting incoming powder from a powder bed or powder dispensing assembly 470 of example apparatus 400. Ingester 420 may also control an amount of powders being diverted, depending how many tests are required for analysis. Process 500 may proceed from 510 to 520.

At 520, process 500 may involve processor 401 controlling test suite 430 to perform one or more tests of test 440(1)-440(K). In some embodiments, one or more specific properties of a powdered material may need to be tightly controlled within a certain range to guarantee the mechanical, electrical, or optical properties of the printed object. In other embodiments, characteristics of powders during a print process may need to be retained for auditing purposes. Test suite 430 may include instruments having capabilities to perform one or more tests of test 440(1)-440(K). For illustrating purposes and without limitation, test 440(1) may measure a distribution of powder sizes by particle size analyzer; test 440(2) may measure a density of powder samples by pycnometer; test 440(3) may identify substances within the powder samples by gas chromatography mass spectrometry. Some example instruments for the possible test suite 430 along with the types of data gathered or property measured are listed, but are not limited to, in the table below. Process 500 may proceed from 520 to 530.

| Example Instrument | Data Gathered or Property Measured |
| --- | --- |
| Dilatometer | Volume changes caused by a physical or chemical process |
| Flash Diffusivity | Thermal diffusivity |
| Gas Chromatography Mass Spectrometry | Identifies different substances within a test sample |
| Gas Pycnometer | Volume and density of solids |
| Inclinometer | Angle of a slope |
| Particle Size Analyzer | Distribution of particle sizes |
| Particle Shape Analyzer | Distribution of particle shapes |
| Profilometer | Surface roughness |
| Scale | Weight |
| Spectrometer | Emissivity, Absorptivity, Reflectance, Transmissivity |
| Thermometer | Temperature |
| Tintometer | Color |

At 530, process 500 may involve processor 401 determining whether to modify a set of printing parameters employed for the print process or whether to abort the print process according to a result characterization from test 440(1)-440(K). The determination may include computer simulations by processor 401 based on a set of models using results of the characterizations as input. Powder samples may have undergone undesired changes for powders without certification or inadequate processing conditions. Test 440(1)-440(K) may provide a real-time feedback on the properties of powders during the print process. Processor 401 may determine to modify one or more printing parameters according characterization results of test 440(1)-440(K). For example, processor 401 may increase or decrease the incident beam intensity provided by print head 480 when gas pycnometer measures a deviation of specified powder density which may affect the energy per unit volume required to melt or sinter the powders. Processor 401 may also control dwell time of the incident beam provided by print head 480 or a thickness of powder layer dispensed by powder dispensing assembly 470 to adjust for the energy requirement change. The temperature of build platform 490 may be controlled to alleviate burden of the energy source by processor 401. If the deviation of the energy per unit volume to the specified powder density is too large, processor 401 may determine to abort the print process since the energy source inside print head 480 may not meet the requirement to melt the powders. In another example, contaminations within powder samples may be detected by gas chromatography mass spectroscopy, which may affect one or more electrical, mechanical and optical properties of the printed object. Thus, processor 401 may determine to abort the print process in such situations. In still other embodiments, the print process can be stopped if characterization results indicate usage of unlicensed powders or dangerous powders, including unlicensed powders likely to result in inferior additive manufacturing results. The characterization results of test 440(1)-440(K) may be stored in memory 402.

In some embodiments, prediction of final print quality based on the results of in-process (in real-time or in-situ) characterizations of powder samples may be performed by simulations using a set of models. For example, dimensional controls of the printed object may rely on a resolution of the incident beam and a temperature gradient of powders across the boundary of melted region. The melted region may expand beyond the intended boundary if the temperature does not drop quick enough across the boundary and result in exceeding the tolerance of the dimensional requirement. The temperature gradient may be simulated by a heat transfer model which calculates a heat conduction rate based on properties of powders such as on the compositions and sizes of powders. If the predicted dimension of a printed object by the simulation model exceeds the tolerance of dimensional requirement, at 530, processor 401 may determine to abort the print process. Process 500 may proceed from 530 to 540.

At 540, process 500 may involve storage container 450 of example apparatus 400 packaging powder samples in a plurality of sample canister 460(1)-460(N). The sample canister 460(1)-460(N) may be stored for analyses that may not be suitable for in-process characterization or for auditing purposes later. Storage container 450 may be capable of packaging powder samples in an atmosphere substantially equivalent to the in-process (in real-time or in-situ) atmosphere inside sample canister 460(1)-460(N). The atmosphere may be air or an inert gas such as nitrogen, carbon dioxide, argon, helium, or other noble gas.

Figure 6:
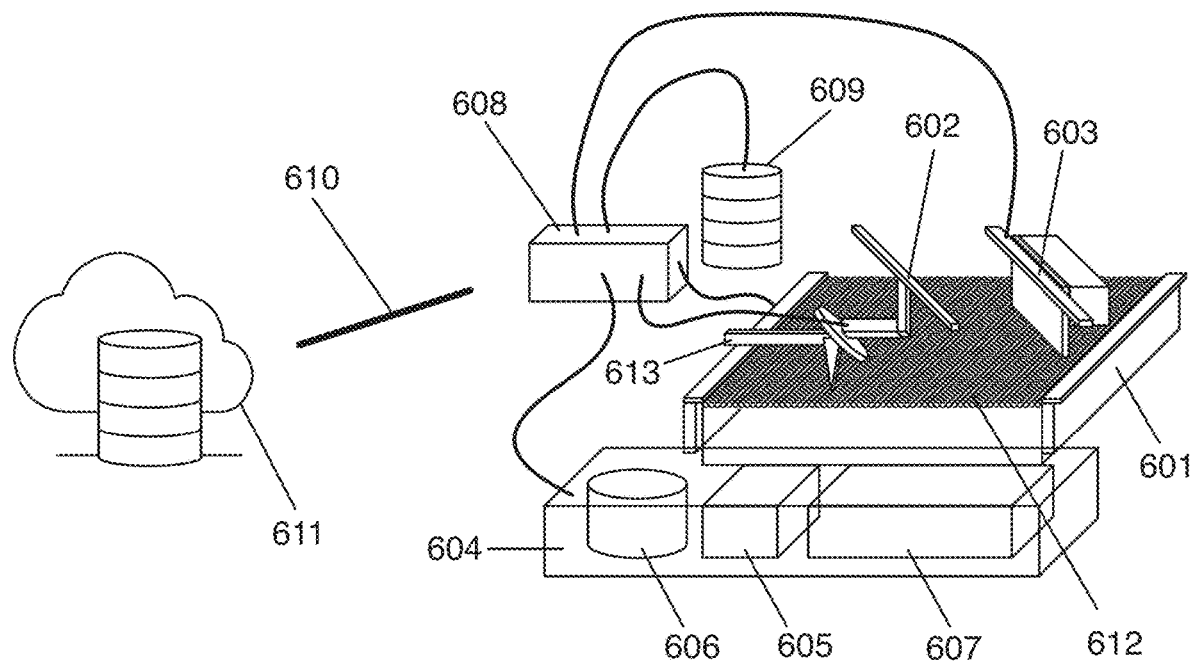
FIG. 6 is an example implementation of an ingester system used in powder bed fusion additive manufacturing in accordance with an embodiment of the present disclosure.

FIG. 6 illustrates an example implementation 600 of collecting powder samples by ingester system 410 in powder bed fusion additive manufacturing in accordance with the present disclosure. In FIG. 6, build platform 601 supporting a powder bed 612 in a powder bed fusion 3D printer is connected to processor 608 together with ingester system 604. The exemplary powder bed fusion 3D printer may measure 1 m by 1 m and is shown without all its side walls for a purpose of clarity. Printing may occur via the action of optical module 602 which directs concentrated laser beam 613 provided by a print head (not shown in FIG. 6) to the surface of powder bed 612. The optical module 602 may be included in the print head in addition to an energy source that provides laser beam 613. Powder bed 612 may be formed by a plurality of powder layers dispensed by powder dispensing assembly 603. The powdered material may include metal, ceramic, plastic powders or other suitable powders able to bond together while subjected to a thermal energy. The processing atmosphere for the powdered material inside the powder bed fusion 3D printer may be air or an inert gas including nitrogen, carbon dioxide, argon, helium, or other noble gas. Ingester system 604 may include ingestion 605, the storage container 606, and test suite 607. Ingester 605 may collect or pick up powder samples in real-time during a print process from powder bed 612 or powder dispensing assembly 603 periodically, randomly, or at predetermined stages. A mechanical arm or diverter mechanism may be implemented as ingester 605 for collecting or picking up powder samples at predetermined locations or randomly and the amount of powder samples being collected may also be predetermined based on a number of requested analyses by users of the powder bed fusion 3D printer. The collected powder samples may be packaged in sample canisters by storage container 606 for auditing purposes or for later analysis. The storage contained may have a substantially equivalent atmosphere to the processing atmosphere used for the powder samples. Test suite 607 may perform characterizations such as those illustrated in test 440(1)-test 440(K) of example apparatus 400 on powder samples in real-time after ingester 605 has collected the powder samples. The characterizations performed by test suite 607 may measure one or more properties or qualities of powder samples from powder bed 612 or powder dispensing assembly 603 using example instruments listed in the table at step 520 of example process 500. The one or more properties of powder samples may include thermal diffusivity, density, surface roughness, weight, emissivity, absorptivity, reflectance, transmissivity, temperature, color, and particle size distribution. Processor 608 may store the characterization result of powder samples in memory 609 or using models in computing facility 611 with the characterization results as inputs to simulation a final dimension, and one or more electrical, mechanical, or optical properties of a printed object.

The results of simulation may be utilized to determine whether to modify the printing parameters or abort the print process. Upon determining to modifying the printing parameters for the printed object during a print process, processor 608 may control an intensity and dwell time of incident beam 613 from the print head, a dispensing rate and a thickness of powders of powder dispensing assembly 603, and a temperature of build platform 601 as well as powder bed 612 to improve the properties or qualities of the printed object according the characterization results and simulation feedbacks. If the results of simulation indicate that a final dimension or one or more electrical, mechanical, or optical properties may not meet the requirement or specification of the printed object, processor 608 may determine to abort the print process. Whether to modify printing parameters or abort the print process may be also determined by users of powder bed fusion 3D printer based on knowledge and experience of previous characterization results. Some of tests in test suite 607 may not be suitable for in-process characterization and may be performed later for an off-site analysis. The processor 608 may have connectivity to the outside world via the Internet 610 which under selected circumstances connects to a cloud computing facility 611 with simulation models, advanced computing, and data storage.

The computer processing of the test data such as those illustrated in test 440(1)-440(K) of powder samples in conjunction with a database and possibly with the additional use of computer simulation models such as those describe at 530 in example process 500, enable a range of process adjustments and actions, either separately or in combination.

The class of process adjustments span the range of simple to extremely sophisticated. Two related examples as described in example process 500 are that print head 480 of example apparatus 400 may adjust its print characteristics such as laser dwell time or intensity in the case of powder bed fusion printers, or the powder dispensing assembly 470 may adjust its powder distribution parameters in terms of dispensing rate and layer thickness, in both cases to realize a more effective and higher quality printed object. Another example is for the printer to adjust printing parameters based on powder sample analysis for a self-protection of the printer, potentially for the case of reactive materials, or non-compatible materials used with the machine itself.

The class of actions may include denial of further service because the powdered material is unauthorized, or that the powdered material may damage the printer, or a potential fire risk due to trace amounts of powdered materials from previous builds mixing and interacting in a dangerous manner. The actions may also serve as a trigger for billing and tracking purposes related to customer contracts, either directly for print services or for service.

A final example combining both process adjustments and actions may be an exemplary scenario of a customer being able to load virtually any powdered material, from any source into the printer, and the printer may adjust its printing parameters and print an object using the loaded powdered material. This could be immensely useful to customers in terms of flexibility and to the ability to use low-cost, high-value powdered materials.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A method comprising the steps of:
   collecting a plurality of powder samples of a powdered material in real-time during a print job;
   performing a set of characterizations on the powder samples;
   aborting the print job responsive to a result of the set of characterizations indicating an alteration of each of one or more powder properties of the collected powder samples beyond a range of specifications; and
   packaging the powder samples in a plurality of sample canisters, with a second atmosphere in the sample canisters substantially equivalent to a first atmosphere utilized during the print job.

2. The method of claim 1, wherein the collecting of the powder samples of the powdered material in real-time comprises collecting the powder samples of the powdered material periodically at a predetermined interval, randomly, or at one or more predetermined stages during, before, or after the print job.

3. The method of claim 1, further comprising the step of aborting the print job when an unsuitable powder is used.

4. The method of claim 1, wherein the first atmosphere or the second atmosphere comprises air or an inert gas.

5. The method of claim 4, wherein the inert gas comprises nitrogen, carbon dioxide, argon, helium, or other noble gas.

6. A method comprising the steps of:
   collecting a plurality of powder samples of a powdered material in real-time during a print job;
   performing a set of characterizations on the powder samples;
   determining whether to modify a set of printing parameters employed during the print job or abort the print job according to a result of the set of characterizations;
   aborting the print job responsive to the result of the set of characterizations indicating an alteration of each of one or more powder properties of the collected powder samples beyond a range of specifications; and
   packaging the powder samples in a plurality of sample canisters, with a second atmosphere in the sample canisters substantially equivalent to a first atmosphere utilized during the print job.

7. The method of claim 6, wherein the set of printing parameters comprises one or more of:
   a temperature of the powder material;
   a intensity of an energy source incident on the powder material;
   a duration of the energy source incident on the powder material;
   a pulse shape of energy source incident on the powder material modulated over time and position on the bed; and
   a thickness of a layer the powder material being dispensed.

8. The method of claim 6, wherein the first atmosphere or the second atmosphere comprises air or an inert gas.

9. The method of claim 8, wherein the inert gas comprises nitrogen, carbon dioxide, argon, helium, or other noble gas.

10. A method of identifying unlicensed powder usage in an additive manufacturing system, comprising:
    collecting a plurality of powder samples of a powdered material during a print job;
    using the collected powder samples for audit and authorization by performing:
      storing the collected powder samples; and
      immediately characterizing the powder samples to determine whether to abort the print job according to a result of the set of characterizations; and
    aborting the print job responsive to the result of the set of characterizations indicating an alteration of each of one or more powder properties of the collected powder samples beyond a range of specifications.

11. The method of claim 10, wherein the collecting of the powder samples of the powdered material in real-time comprises collecting the powder samples of the powdered material periodically at a predetermined interval, randomly, or at one or more predetermined stages during, before, or after the print job.

* * * * *